(12) United States Patent
Ren et al.

(10) Patent No.: US 11,538,547 B2
(45) Date of Patent: Dec. 27, 2022

(54) SYSTEMS AND METHODS FOR READ ERROR RECOVERY

(71) Applicant: SK hynix Inc., Gyeonggi-do (KR)

(72) Inventors: Jingjian Ren, San Jose, CA (US); Alexey Lisichenok, San Jose, CA (US); Jay Kim, San Jose, CA (US); Sungho Kim, San Jose, CA (US); Eric Wong, San Jose, CA (US); Sunmin Yun, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/094,218

(22) Filed: Nov. 10, 2020

(65) Prior Publication Data

US 2022/0148671 A1 May 12, 2022

(51) Int. Cl.
*G11C 29/44* (2006.01)
*G11C 29/12* (2006.01)
*G11C 29/42* (2006.01)

(52) U.S. Cl.
CPC ........ *G11C 29/44* (2013.01); *G11C 29/12005* (2013.01); *G11C 29/42* (2013.01)

(58) Field of Classification Search
CPC .................................................. G11C 29/44
See application file for complete search history.

(56) References Cited

U.S. PATENT DOCUMENTS 10,102,920 B2   10/2018  Reusswig et al.
10,469,103 B1 *  11/2019  Jeong ................. H03M 13/1111
10,636,495 B2    4/2020  Chen et al.

* cited by examiner

*Primary Examiner* — Douglas King
(74) *Attorney, Agent, or Firm* — IP & T Group LLP

(57) ABSTRACT

Embodiments provide a scheme for determining the order of read threshold voltages used in a read error recovery operation for a memory system. A controller performs one or more read operations on a memory device using one or more read voltages among a plurality of read voltages in a set order. The controller detects a successful read operation among the one or more read operations. The controller determines one or more credits for the one or more read voltages, respectively, in response to the detected successful read operation. The controller updates the set order based on the determined credits.

20 Claims, 13 Drawing Sheets

FIG. 10

|  | RR#0 | RR#1 | RR#2 | RR#3 | RR#4 | ..... | RR#(N-1) |
|---|---|---|---|---|---|---|---|
| Read Order | 1 | 2 | 3 | 4 | 5 | ..... | N |
|  | "Fail" | "Fail" | "Success" |  |  |  |  |
| Initial Credit | N | N-1 | N-2 | N-3 | N-4 | ..... | 1 |
|  |  |  | ↓ +1 |  |  |  |  |
| Updated Credit | N | N-1 | N-1 | N-3 | N-4 | ..... | 1 |
| Updated Order | 1 | 2 ⟷ Swap ⟷ 3 | | 4 | 5 | ..... | N |
|  |  | ③ | ② |  |  |  |  |

FIG. 11

| | (1110) | (1120) | (1130) | (1140) | (1150) | (1160) | (1170) | (1180) | |
|---|---|---|---|---|---|---|---|---|---|
| 1 | RR#0 | RR#0 | RR#0 | RR#0 | √RR#1 | RR#1 | RR#1 | RR#1 | RR##4 | 9 |
| 2 | RR#1 | RR#2 | RR#2 | √RR#1 | RR#0 | RR#0 | RR#0 | √RR#4 | RR#1 | 8 |
| 3 | √RR#2 | RR#1 | √RR#1 | RR#2 | RR#2 | RR#2 | √RR#4 | RR#0 | RR#0 | 7 |
| 4 | RR#3 | RR#3 | RR#4 | RR#4 | RR#4 | √RR#4 | RR#2 | RR#2 | RR#2 | 6 |
| 5 | RR#4 | √RR#4 | RR#3 | RR#3 | RR#3 | RR#3 | RR#3 | RR#3 | RR#3 | 5 |
| 6 | RR#5 | RR#5 | RR#5 | RR#5 | RR#5 | RR#5 | RR#5 | RR#5 | RR#5 | 4 |
| 7 | RR#6 | RR#6 | RR#6 | RR#6 | RR#6 | RR#6 | RR#6 | RR#6 | RR#6 | 3 |
| 8 | RR#7 | RR#7 | RR#7 | RR#7 | RR#7 | RR#7 | RR#7 | RR#7 | RR#7 | 2 |
| 9 | RR#8 | RR#8 | RR#8 | RR#8 | RR#8 | RR#8 | RR#8 | RR#8 | RR#8 | 1 |
| 10 | RR#9 | RR#9 | RR#9 | RR#9 | RR#9 | RR#9 | RR#9 | RR#9 | RR#9 | 0 |

Advanced Read Retries

FIG. 12

| | RR#0 | RR#1 | RR#2 | RR#3 | RR#4 | ..... | RR#(N-1) |
|---|---|---|---|---|---|---|---|
| Read Order | 1 "Fail" | 2 "Fail" | 3 "Success" | 4 | 5 | ..... | N |
| Initial Credit | N | N-1 | N-2 | N-3 | N-4 | ..... | 1 |
| | -1 ↓ | -1 ↓ | highest Credit ↓ | | | | |
| Updated Credit | N-1 | N-2 | N | N-3 | N-4 | ..... | 1 |
| Updated Order | ② | ③ | ① | 4 | 5 | ..... | N |

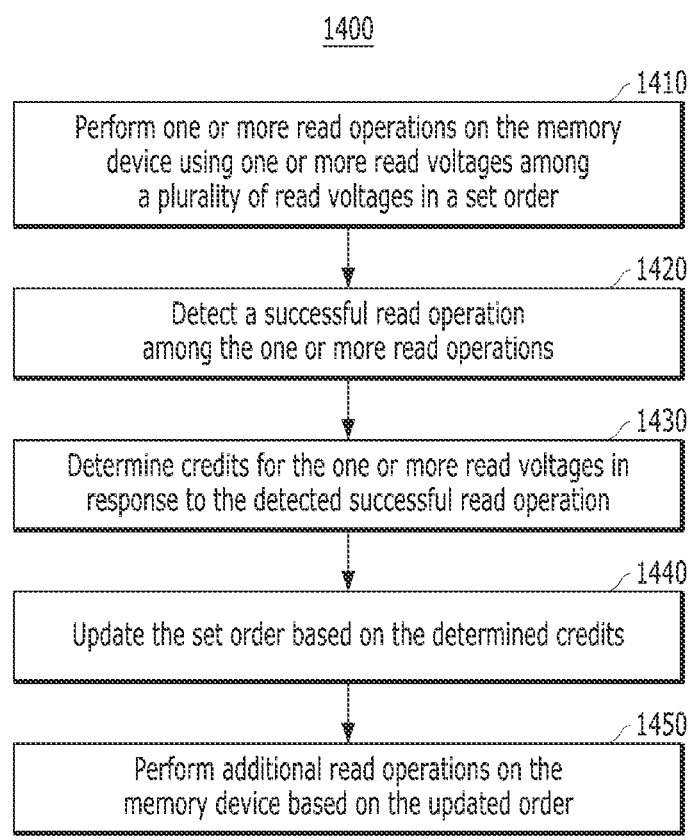

SYSTEMS AND METHODS FOR READ ERROR RECOVERY

BACKGROUND

1. Field

Embodiments of the present disclosure relate to a read error recovery scheme in a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may perform a read operation and perform a read error recovery operation when the read operation failed.

SUMMARY

Aspects of the present invention include a system and a method for efficiently determining the order of read threshold voltages used in a read error recovery operation for a memory system.

In one aspect, a memory system includes a memory device and a controller. The controller performs one or more read operations on the memory device using one or more read voltages among a plurality of read voltages in a set order; detects a successful read operation among the one or more read operations; determines one or more credits for the one or more read voltages, respectively, in response to the detected successful read operation; and updates the set order based on the determined credits.

In another aspect, a method for operating a memory system, which includes a memory device and a controller coupled to the memory device comprises: performing one or more read operations on the memory device using one or more read voltages among a plurality of read voltages in a set order; detecting a successful read operation among the one or more read operations; determining one or more credits for the one or more read voltages, respectively, in response to the detected successful read operation; and updating the set order based on the determined credits.

In yet another aspect, a system includes a memory to store executable instructions for using a plurality of read voltages for one or more read operations on a memory device; and a control component in communication with the memory to read the executable instructions from the memory to: perform one or more read operations on the memory device using one or more read voltages among a plurality of read voltages in a set order; detect a successful read operation among the one or more read operations; determine one or more credits for the one or more read voltages, respectively, in response to the detected successful read operation; and update the set order based on the determined credits.

Additional aspects of the present invention will become apparent from the following description.

BRIEF DESCRIPTION OF THE DRAWINGS

FIG. 10 is a diagram illustrating a gradual credit gaining scheme in accordance with an embodiment of the present invention.

FIG. 11 illustrates iteratively updating the order of read threshold voltages according to a gradual credit gaining scheme.

FIG. 12 is a diagram illustrating an aggressive credit gaining scheme in accordance with an embodiment of the present invention.

FIG. 14 is a flowchart illustrating an operation for determining a read threshold voltage based on credits in accordance with an embodiment of the present invention.

DETAILED DESCRIPTION

Figure 1:
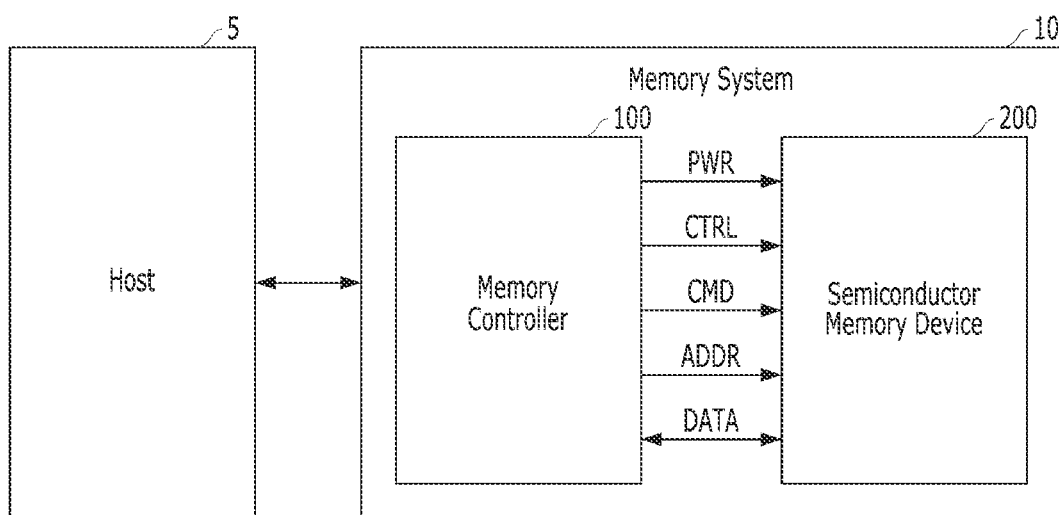
FIG. 1 is a block diagram illustrating a data processing system.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). The term "embodiments" as used herein does not necessarily refer to all embodiments. Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operation of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
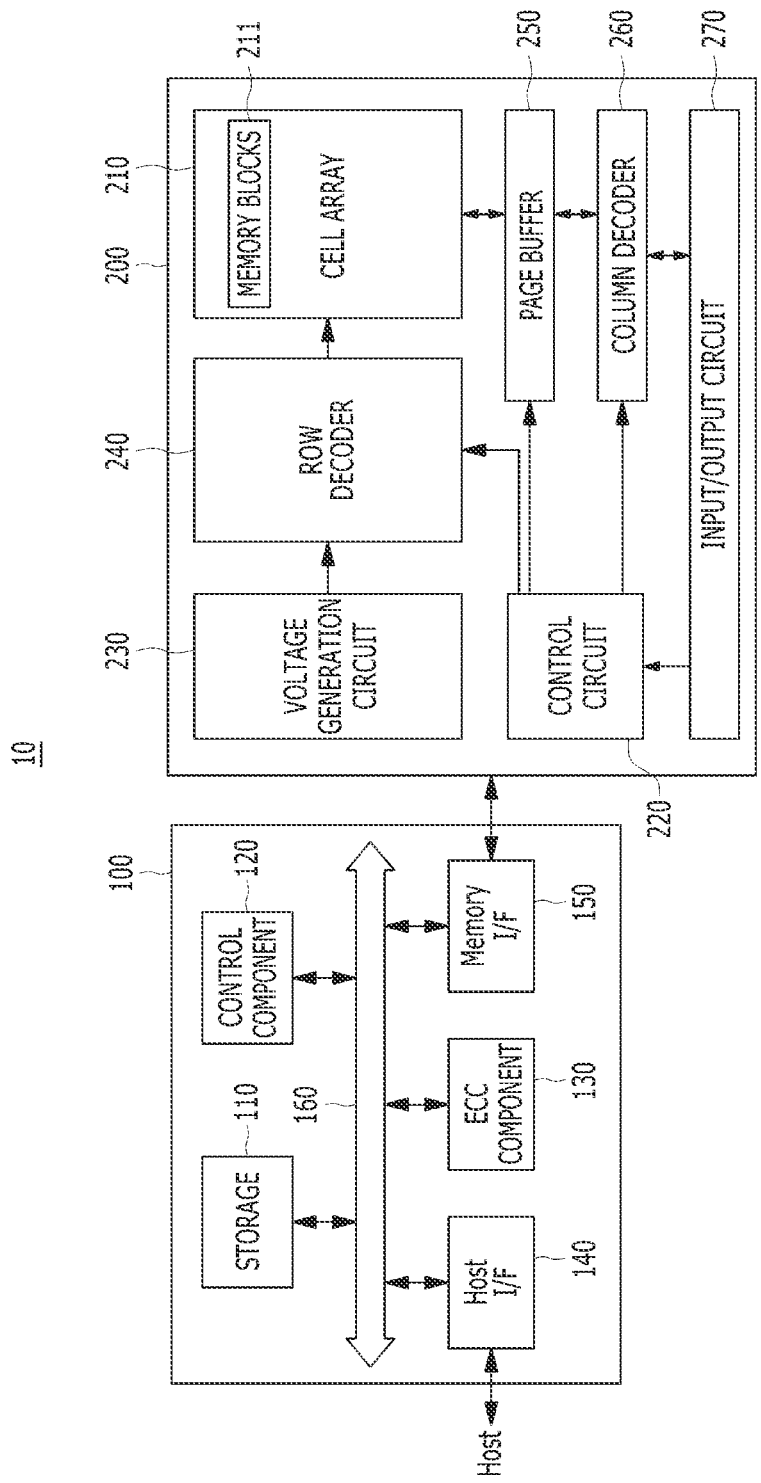
FIG. 2 is a block diagram illustrating a memory system.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
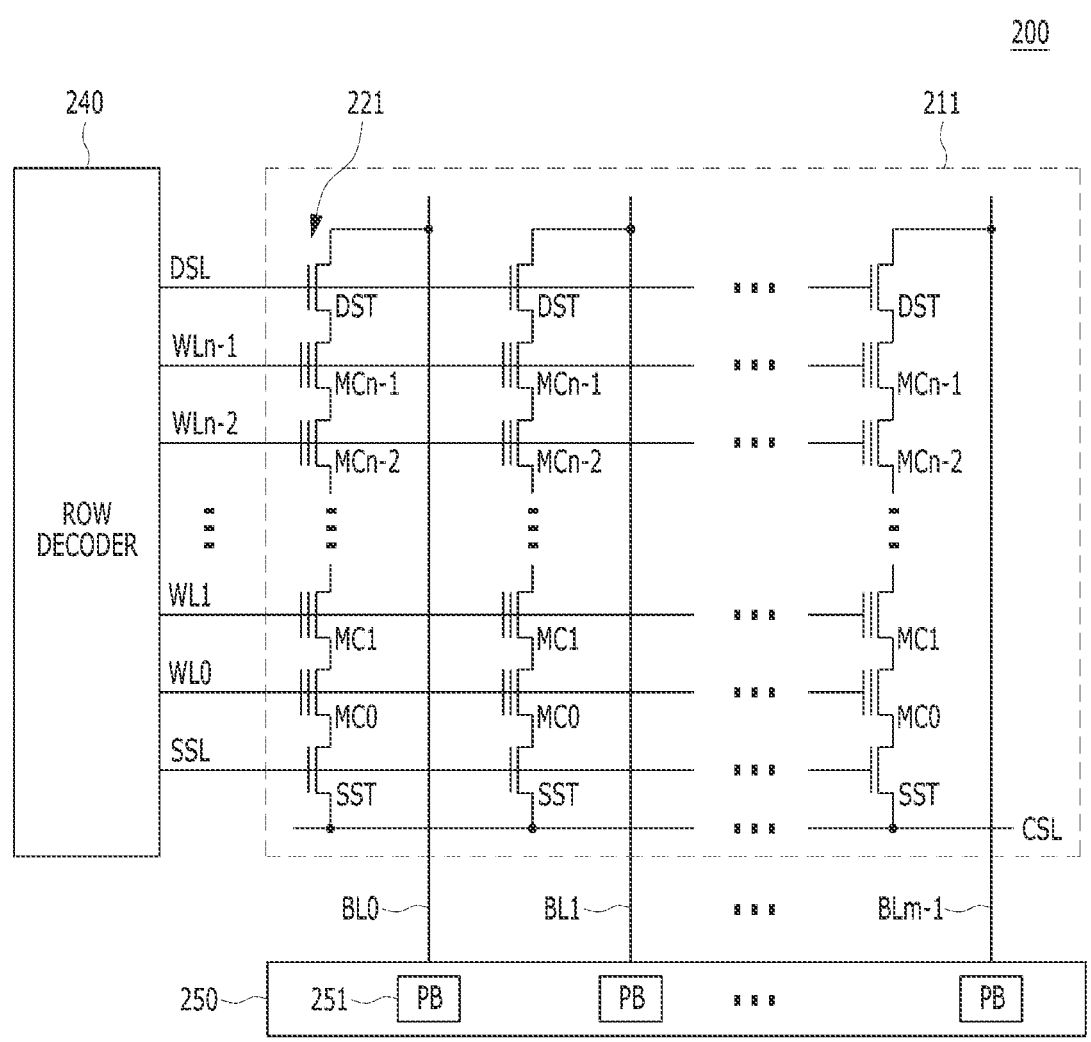
FIG. 3 is a circuit diagram illustrating a memory block of a memory device.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm-1. The page buffers 251 may operate in response to page buffer control signals. For example, the page buffers 251 may temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
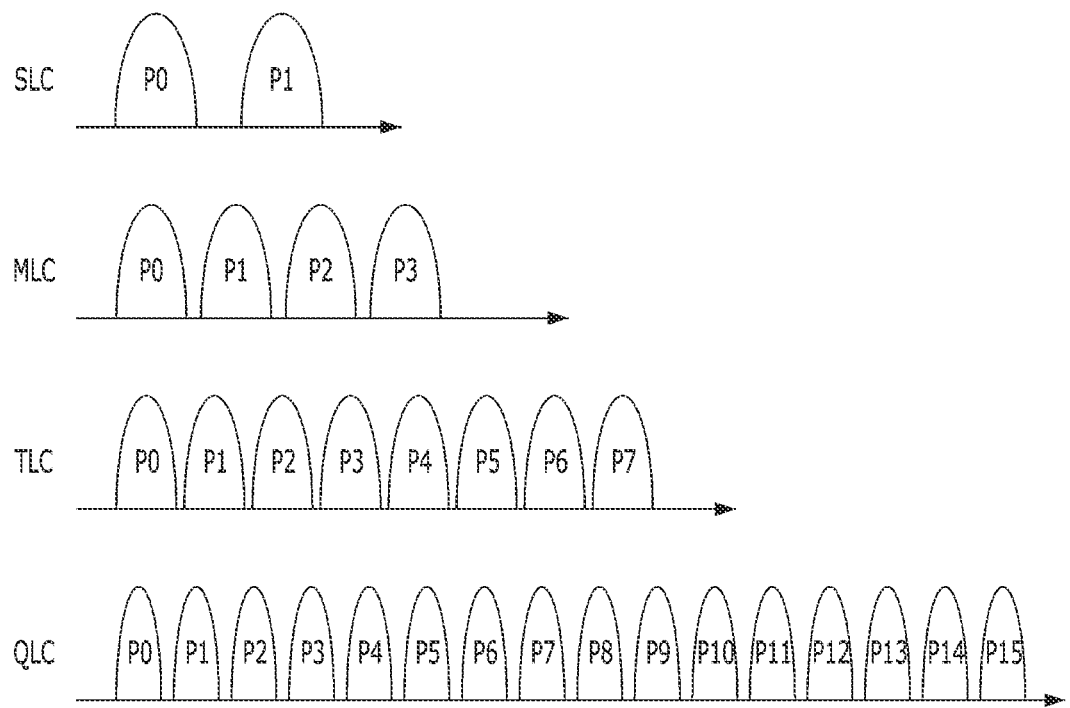
FIG. 4 is a diagram illustrating distributions of states for different types of cells of a memory device.

FIG. 4 is a diagram illustrating distributions of states or program voltage (PV) levels for different types of cells of a memory device.

Referring to FIG. 4, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement.

An SLC may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states, each QLC may program or store four bits according to a set coding method.

Referring back to FIGS. 2 and 3, the memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is asserted. During a read operation, the word line is again asserted, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as SSD.

Figure 5A:
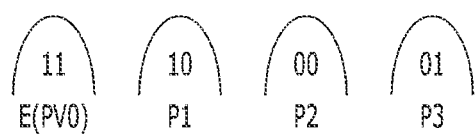
FIG. 5A is a diagram illustrating an example of Gray coding for a multi-level cell (MLC).

FIG. 5A is a diagram illustrating an example of coding for a multi-level cell (MLC).

Referring to FIG. 5A, an MLC may be programmed using a set type of coding. An MLC may have 4 program states, which include an erased state E (or PV0) and a first program state PV1 to a third program state PV3. The erased state E (or PV0) may correspond to "11." The first program state PV1 may correspond to "10." The second program state PV2 may correspond to "00." The third program state PV3 may correspond to "01."

Figure 5B:
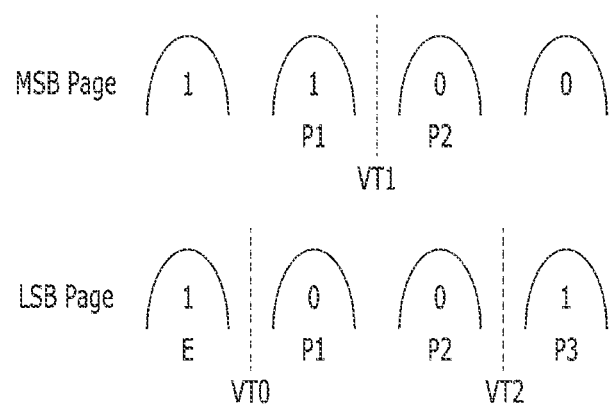
FIG. 5B is a diagram illustrating state distributions for pages of a multi-level cell (MLC).

In the MLC, as shown in FIG. 5B, there are 2 types of pages including LSB and MSB pages. 1 or 2 thresholds may be applied in order to retrieve data from the MLC. For an MSB page, the single threshold value is VT1. VT1 distinguishes between the first program state PV1 and the second program state PV2. For an LSB page, there are two thresholds: VT0 and VT2. VT0 distinguishes between the erased state E and the first program state PV1. VT2 distinguishes between the second program state PV2 and the third program state PV3.

Figure 6A:
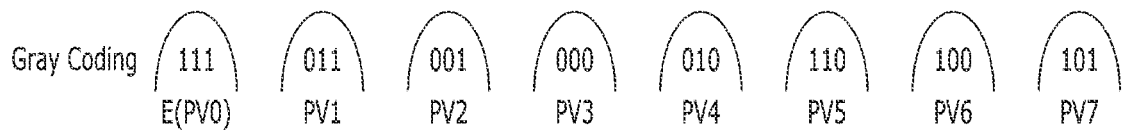
FIG. 6A is a diagram illustrating an example of Gray coding for a triple-level cell (TLC).

FIG. 6A is a diagram illustrating an example of Gray coding for a triple-level cell (TLC).

Referring to FIG. 6A, a TLC may be programmed using Gray coding. A TLC may have 8 program states, which include an erased state E (or PV0) and a first program state PV1 to a seventh program state PV7. The erased state E (or PV0) may correspond to "111." The first program state PV1 may correspond to "011." The second program state PV2 may correspond to "001." The third program state PV3 may correspond to "000." The fourth program state PV4 may correspond to "010." The fifth program state PV5 may correspond to "110." The sixth program state PV6 may correspond to "100." The seventh program state PV7 may correspond to "101."

Figure 6B:
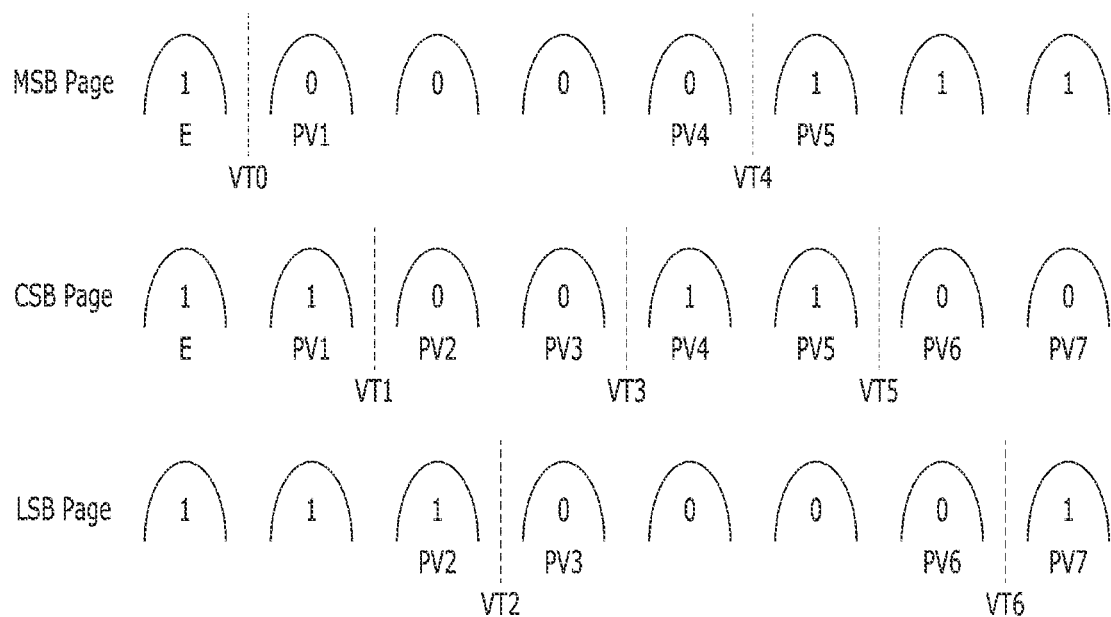
FIG. 6B is a diagram illustrating state distributions for pages of a triple-level cell (TLC).

In the TLC, as shown in FIG. 6B, there are 3 types of pages including LSB, CSB and MSB pages. 2 or 3 thresholds may be applied in order to retrieve data from the TLC. For an MSB page, there are two thresholds: VT0 that distinguishes between an erase state E and a first program state PV1 and VT4 that distinguishes between a fourth program state PV4 and a fifth program state PV5. For a CSB page, there are three thresholds: VT1, VT3 and VT5. VT1 distinguishes between a first program state PV1 and a second program state PV2. VT3 distinguishes between a third program state PV3 and the fourth program state PV4. VT5 distinguishes between the fourth program state PV5 and the sixth program state PV6. For an LSB page, there are two thresholds: VT2 and VT6. VT2 distinguishes between the second program state PV2 and the third program state PV3. VT6 distinguishes between the sixth program state PV6 and a seventh program state PV7.

After a memory array including a plurality of memory cells is programmed as described in FIGS. 5A and 6A, when a read operation is performed on the memory array using a certain reference voltage such as a read threshold voltage (also called "read voltage level" or "read threshold"), the electrical charge levels of the memory cells (e.g., threshold voltage levels of transistors of memory cells) are compared to one or more reference voltages to determine the state of individual memory cells. When a certain read threshold is applied to the memory array, those memory cells that have threshold voltage levels higher than the certain reference voltage are turned on and detected as "on" cell, whereas those memory cells that have threshold voltage levels lower than the certain reference voltage are turned off and detected as "off" cell, for example. Therefore, each read threshold is arranged between neighboring threshold voltage distribution windows corresponding to different programmed states so that each read threshold can distinguish such programmed states by turning on or off the memory cell transistors.

When a read operation is performed on memory cells in a data storage device using MLC technology, the threshold voltage levels of the memory cells are compared to more than one read thresholds to determine the state of individual memory cells. Read errors can be caused by distorted or overlapped threshold voltage distributions. An ideal memory cell threshold voltage distribution can be significantly distorted or shifted to overlap with a neighboring threshold voltage distribution due to, e.g., program and erase (P/E) cycle, cell-to-cell interference, and data retention errors. For example, as program/erase cycles increase, the margin between neighboring threshold voltage distributions of different programmed states decreases and eventually the distributions start overlapping. As a result, the memory cells with threshold voltages that fall within the overlapping range of the neighboring distributions may be read as being programmed to a value other than the original targeted value and thus cause read errors. Such read errors may be managed in most situations by using error correction codes (ECC). When the number of bit errors on a read operation exceeds the ECC correction capability of the data storage, the read operation fails. When the read operation failed, an error recovery algorithm may be performed.

As described above, in typical memory systems such as NAND-based storage systems (e.g., SSDs), a read operation in a normal mode is performed until an uncorrectable error occurs. Once an uncorrectable error occurs, memory systems operate in an error recovery mode which involves several distinct steps to correct the error and supply intended data.

Figure 7:
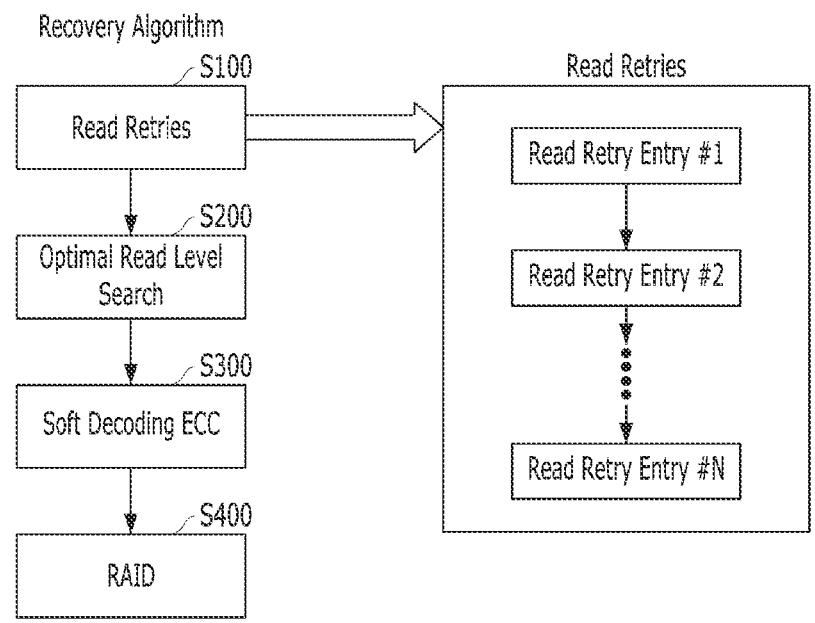
FIG. 7 is a diagram illustrating flow of an error recovery algorithm in a memory system.

FIG. 7 is a diagram illustrating flow of an error recovery algorithm in a memory system.

Referring to FIG. 7, the controller 120 may perform one or more read retry operations for the memory cells using one or more read threshold voltages applied in a set order (S100). For example, the read threshold voltages may include N (e.g., N is 50) read threshold voltages (or read voltage levels) including a first read threshold voltage to an Nth read threshold voltage. The read retry operations may be performed using the read threshold voltages in a fixed order, for example, in the order of a first read threshold voltage, a second read threshold voltage, and an Nth read threshold voltage. The controller 120 may perform the read retry operations until it is determined that decoding associated with a corresponding read retry operation is successful.

When all read retry operations using the read threshold voltages failed, the controller 120 may perform additional recovery operations. For example, the additional recovery operations may include an optimal read threshold voltage search (S200), a soft decoding using an error correction code (ECC) (S300) and a redundant array of independent disks (RAID) recovery (S400).

As shown in FIG. 7, the first step of the error recovery algorithm is to perform read retry operations (Read Retries). In these read retries, additional read and decoding (i.e., hard decoding) operations are attempted. For these additional read attempts, read threshold voltages are determined from a look-up table called Read Retry Table, in which each read threshold voltage is denoted a ready retry entry. Effectiveness of previously-applied read threshold voltages obtained from the table affects read recovery efficiency. These read retry threshold voltages are predetermined with a fixed order in consideration of cell condition for each memory device (e.g., retention, disturb). However, in systems that have been proposed, these read retry threshold voltages are applied blindly for read retries without any knowledge of real conditions that memory cells experience. For example, even if the cell condition in a memory device has changed, these read retry threshold voltages are applied in the fixed order, thus read error recovery latency and read latency are increased. In this circumstance, typically multiple read retries, which turn out to be unsuccessful and hence unnecessary, have to be executed before an effective read retry threshold voltage is found. Accordingly, a scheme for a memory device capable of adaptively determining the order of read retry threshold voltages based on cell condition(s) is desirable.

Embodiments provide a scheme to dynamically adjust the order of read threshold voltages according to the history (i.e., success or fail) of past read operations. Read threshold voltages are given initial recovery credits. A read threshold voltage used in a successful read operation obtains an additional credit and the order of the read threshold voltages is adjusted based on updated credits. In this scheme, a read threshold voltage that results in a higher success recovery rate has higher credits and is placed at a higher position in the read retry table. The higher the position of a read threshold voltage in the read retry table, the earlier such voltage is used in the read retry attempts, thus reducing read latency. This credit-gaining process and resulting read retry order self-adjust as the read retry operations progress. The process is intelligent in that it learns from the past and self-adapts to memory cell conditions of a memory device. This scheme is denoted an adaptive read retry (ARR) scheme. The ARR scheme, including its read retry table of adaptively ordered read retry voltages, may improve performance, latency, consistency, robustness and quality of service (QoS) of a memory system without using a large amount of computational resources.

Figure 8:
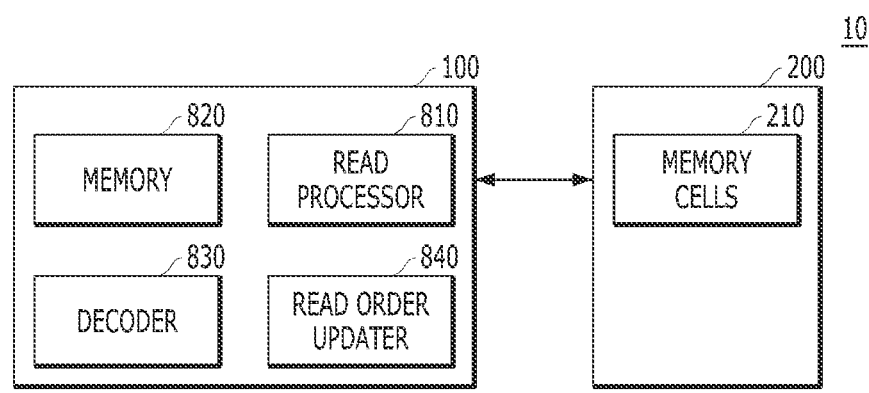
FIG. 8 is a diagram illustrating a memory system in accordance with an embodiment of the present invention.

FIG. 8 is a diagram illustrating a memory system 10 in accordance with an embodiment of the present invention.

Referring to FIG. 8, the memory system 10 may include a controller 100 and a memory device 200. The memory device 200 may include a plurality of memory cells (e.g., NAND flash memory cells) 210. The memory cells are arranged in an array of rows and columns as shown in FIG.

3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is asserted. During a read operation, the word line is again asserted, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as an SSD.

The controller 100 may include a read processor 810, a memory 820, a decoder 830 and a read order updater 840. Although it is illustrated that components of the controller 100 are implemented separately, these components may be implemented with an internal component (i.e., firmware (FW)) of the control component 120 in FIG. 2. Although not shown in FIG. 8, the controller 100 and the memory device 200 may include various other components as shown in FIG. 2.

The read processor 810 may control a read operation for memory cells 210 of the memory device 200 using a set read threshold voltage in response to a read request from a host (e.g., the host 5 of FIG. 1). The set read threshold voltage may be a previously used read threshold voltage (i.e., history read threshold voltage). The history read threshold voltage may be the read threshold voltage used in the last successful decoding, that is, the last-used read voltage that resulted in a read-passed read operation.

Figure 9:
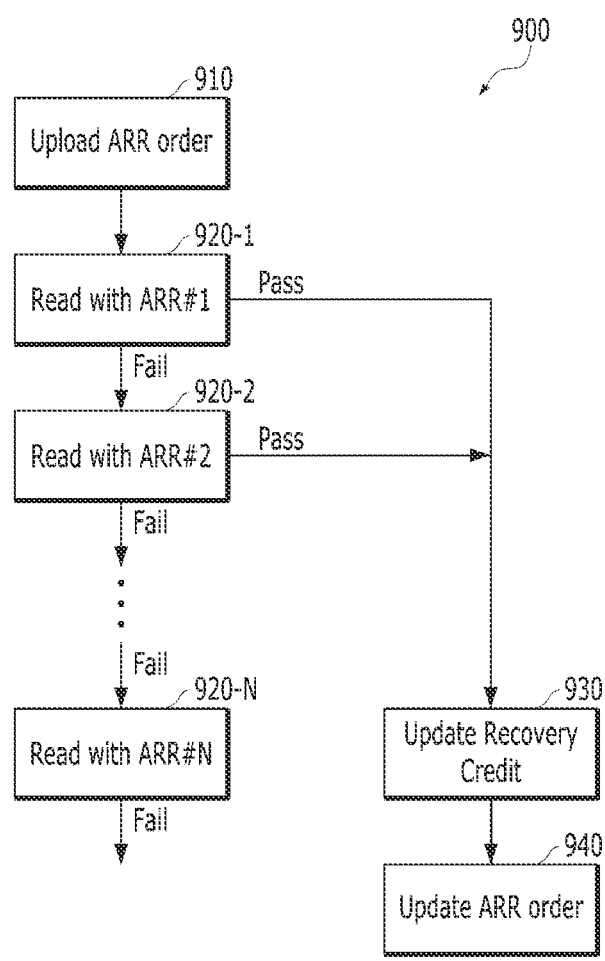
FIG. 9 is a diagram illustrating flow of an adaptive read retry operation in accordance with an embodiment of the present invention.

When the read operation using the set read threshold voltage failed, the read processor 810 perform one or more additional read operations (i.e., read retry operations) until it is determined that decoding associated with a corresponding read retry operation is successful. The read processor 810 may control the read retry operations using a plurality of read threshold voltages. The memory 820 may include a table (i.e., an adaptive read retry table), which stores adaptively-ordered read retry threshold voltages, as shown in FIG. 9. In some embodiments, the adaptive read retry table may further store the credit history of the read threshold voltages in a particular order. The memory 820 may be implemented with a system memory such as a dynamic random access memory (DRAM), a static random access memory (SRAM) or a NAND flash memory. The adaptive read retry table may be managed at different levels. In an embodiment, the adaptive read retry table may be for all NAND dies in a memory device of a memory system (e.g., SSD). In another embodiment, there are multiple adaptive read retry tables. In a multiple adaptive read retry table arrangement, there may be a table for each NAND die in the memory device, for each block of a NAND die in the memory device, or for each wordline or page in a block of a NAND die in the memory device.

The decoder 830 may decode data associated with each read operation. It may be determined whether a read operation using the highest-ordered read threshold voltage selected from the plurality of read threshold voltages, succeeded or failed, depending on the decoding result of the decoder 830. If that read operation failed, the read processor 810 may direct that an additional read operation be performed on the memory cells 210, using the second-highest-ordered read threshold voltage of the plurality of read threshold voltages. An initial read threshold voltage order may be set by the read order updater 840, which may also change the order of such voltages throughout the process.

Figure 13:
FIG. 13 illustrates iteratively updating the order of read threshold voltages according to an aggressive credit gaining scheme.

The read order updater 840 may determine a recovery credit for each read retry voltage in response to a successful read retry operation using that read retry voltage. In some embodiments, a recovery credit (positive or negative) may be determined by success or failure of a read attempt with a certain read retry threshold voltage. If a read attempt is successful with a read retry threshold voltage, e.g., entry #N, the #N read retry voltage earns a recovery credit. If a read attempt fails with the #N read retry threshold voltage, the #N read retry threshold voltage loses a recovery credit. There are various ways to determine how recovery credits are given or taken away, and each way may target change of a different memory cell condition. In some embodiments, recovery credits may be obtained according to a gradual credit gaining scheme (FIGS. 10 and 11) or an aggressive credit gaining scheme (FIGS. 12 and 13).

Further, the read order updater 840 may update the initial read order based on credits that are determined in an initial round of the read retry process. The read order updater 840 may update the initial read order, stored in the ARR table of the memory 810, according to various credit gaining schemes. In an embodiment, the read order updater 840 may update the initial read order according to a gradual credit gaining scheme of FIG. 11. In an embodiment, the read order updater 840 may update the initial order according to an aggressive credit gaining scheme of FIG. 12. The read processor 810 may control read retry operations based on the updated read order, until it is determined that decoding associated with a corresponding read retry operation is successful.

FIG. 9 is a diagram illustrating flow of an adaptive read retry operation 900 in accordance with an embodiment of the present invention. The adaptive read retry operation 900 may be performed by components of the controller 100 in FIG. 8.

Referring to FIG. 9, at operation 910, the controller 100 may upload an adaptive read retry (ARR) order of read retry threshold voltages from the memory 810. The controller 100 may control read retry operations based on the initial and updated read orders as needed, until it is determined that decoding associated with a corresponding read retry operation is successful.

At operation 920-1, the controller 100 may control a read operation using the highest-ordered read threshold voltage (i.e., ARR #1). When it is determined that the read operation using ARR #1 failed, at operation 920-2, the controller 100 may control a read operation using the second-highest-ordered read threshold voltage (i.e., ARR #2). As read operations with successively lower-ordered read threshold voltages continue to fail, a read operation with the (N−1)th ordered read threshold voltage (ARR #N) is attempted. If that failed, at operation 920-N, the controller 100 may control a read operation using the Nth-ordered read threshold voltage, which is the lowest in the order.

At any point in the read retry process, if it is determined that a particular read threshold voltage resulted in successful decoding, at operation 930, the controller 100 may update recovery credits for the plurality of read voltages in response to a successful read retry operation. That is, the read threshold voltage that was successful may receive an increase to its recovery credit and each of the other read threshold voltages that were unsuccessful may have its recovery credit reduced. At operation 940, the read order updater 840 may update the initial read order based on the determined recovery credits.

FIG. 10 is a diagram illustrating a gradual credit gaining scheme in accordance with an embodiment of the present invention. The gradual credit gaining scheme may be performed by the read order updater 840 in FIG. 8.

Referring to FIG. 10, N read threshold voltages RR #0 to RR #(N−1) for respective read retry operations are stored in the memory 810. The initial read order may be set in the order of the voltages: RR #0→RR #1→RR #2→RR #3→RR #4→ . . . →RR #(N−1). In other words, the first read threshold voltage RR #0 is the highest-ordered read threshold voltage, the second read threshold voltage RR #1 is the second-highest-ordered read threshold voltage, and the Nth read threshold voltage RR #(N−1) is the lowest-ordered read threshold voltage. Each of the read threshold voltages is assigned an initial recovery credit. In the illustrated example, initial recovery credits may be set in descending order: RR #0 (credit N)→RR #1 (credit N−1)→RR #2 (credit N−2)→RR #3 (credit N−3)→RR #4 (credit N−4)→ . . . →RR #(N−1) (credit 1). In other words, the initial recovery credit is higher for higher-ordered read threshold voltages: the first read threshold voltage RR #0, which is the highest-ordered read threshold voltage, has the highest credit, the second read threshold voltage RR #1 has the second highest credit, and the Nth read threshold voltage, which is the lowest-ordered read threshold voltage, RR #(N−1) has the lowest credit.

When it is determined that the read operations using read threshold voltages RR #0 and RR #1 failed, and the read operation using the read threshold voltages RR #2 succeeded, the read order updater 840 may increase the recovery credit for RR #2 by a set value (e.g., 1). In other words, the recovery credit "N−2" for the read voltage RR #2, which was successful, is updated to credit "N−1." With this update, the increased credit "N−1" for the read voltage RR #2 is the same as the initial recovery credit "N−1" for the read voltage RR #1, which is a higher in the current order than the read voltage RR #2. The read order updater 840 may swap RR #2 with RR #1 in the order such that RR #2 is second in the order and RR #1 is third in the order. Thus, the new read order is: RR #0→RR #2→RR #1→RR #3→RR #4→ . . . →RR #(N−1).

FIG. 11 illustrates a process of iteratively updating the order of read threshold voltages according to a gradual credit gaining scheme. In FIG. 11, RR # with a check mark "✓" represents a successful read threshold voltage and bolded RR # represents a read threshold voltage that has been moved up or down in the order.

Referring to FIG. 11, it is assumed that 10 read threshold voltages RR #0 to RR #9 have initial credits that descend in value down the order. For example, a read threshold voltage RR #0 has an initial credit "9," a read threshold voltage RR #1 has an initial credit "8," a read threshold voltage RR #2 has an initial credit "7", continuing to a read threshold voltage RR #9 that has an initial credit "0."

In a first round (1110), the read operations using the read threshold voltages RR #0 and RR #1 failed, and the read operation using the read threshold voltage RR #2 succeeded. The recovery credit "7" for the successful read voltage RR #2 is increased to "8." Since the updated credit "8" of read voltage RR #2 is the same as the recovery credit "8" for the higher ordered read voltage RR #1, RR #1 and RR #2 switch places in the order. Thus, the new (updated) read order is: RR #0 (credit 9)→RR #2 (credit 8)→RR #1 (credit 7)→RR #3 (credit 6)→RR #4 (credit 5)→ . . . →RR #9 (credit 0).

In a second round (1120), the read operations using the read threshold voltages RR #0, RR #2, RR #1 and RR #3 failed, and the read operation using the read threshold voltage RR #4 succeeded. The recovery credit "5" for the successful read voltage RR #4 is increased to "6." Since the updated credit "6" of read voltage RR #4 is the same as the recovery credit "6" for the higher ordered read voltage RR #3, RR #4 and RR #3 switch places in the order. Thus, the new (updated) read order is: RR #0 (credit 9)→RR #2 (credit 8)→RR #1 (credit 7)→RR #4 (credit 6)→RR #3 (credit 5)→ . . . →RR #9 (credit 0).

In a third round (1130), the read operations using the read threshold voltages RR #0 and RR #2 failed, and the read operation using the read threshold voltage RR #1 succeeded. The recovery credit "7" for the successful read voltage RR #1 is updated (increased) to "8." Since the updated credit "8" of RR #1 is the same as the recovery credit "8" for the higher ordered read voltage RR #2, RR #1 and RR #2 switch places in the order. Thus, the new (updated) read order is: RR #0 (credit 9)→RR #1 (credit 8)→RR #2 (credit 7)→RR #4 (credit 6)→RR #3 (credit 5)→ . . . →RR #9 (credit 0).

In a fourth round (1140), the read operation using the read threshold voltage RR #0 failed, and the read operation using the read threshold voltage RR #1 succeeded. The recovery credit "8" for the successful read voltage RR #1 is updated (increased) to "9." Since the updated credit "9" of RR #1 is the same as the recovery credit "9" for the higher ordered read voltage RR #0, RR #0 and RR #1 switch places in the order. Thus, the new (updated) read order is: RR #1 (credit 9)→RR #0 (credit 8)→RR #2 (credit 7)→RR #4 (credit 6)→RR #3 (credit 5)→ . . . →RR #9 (credit 0).

In a fifth round (1150), the read operation using the read threshold voltage RR #1 succeeded. The recovery credit "9" for the successful read voltage RR #1 is the highest credit. In this case, the orders of the read voltages are maintained. Thus, previously updated read order is maintained: RR #1 (credit 9)→RR #0 (credit 8)→RR #2 (credit 7)→RR #4 (credit 6)→RR #3 (credit 5)→ . . . →RR #9 (credit 0).

In a sixth round (1160), the read operations using the read threshold voltages RR #1, RR #0 and RR #2 failed, and the read operation using the read threshold voltage RR #4 succeeded. The recovery credit "6" for the successful read voltage RR #4 is updated (increased) to "7." Since the updated credit "7" of RR #4 is the same as the recovery credit "7" for the higher ordered read voltage RR #2, RR #2 and RR #4 switch places in the order. Thus, the new (updated) read order is: RR #1 (credit 9)→RR #0 (credit 8)→RR #4 (credit 7)→RR #2 (credit 6)→RR #3 (credit 5)→ . . . →RR #9 (credit 0).

In a seventh round (1170), the read operations using the read threshold voltages RR #1 and RR #0 failed, and the read operation using the read threshold voltage RR #4 succeeded. The recovery credit "7" for the successful read voltage RR #4 is updated (increased) to "8." Since the updated credit "8" of RR #4 is the same as the recovery credit "8" for the higher ordered read voltage RR #0, RR #0 and RR #4 switch places in the order. Thus, the new (updated) read order is: RR #1 (credit 9)→RR #4 (credit 8)→RR #0 (credit 7)→RR #2 (credit 6)→RR #3 (credit 5)→ . . . →RR #9 (credit 0).

In an eighth round (1180), the read operation using the read threshold voltage RR #1 failed, and the read operation using the read threshold voltage RR #4 succeeded. The recovery credit "8" for the successful read voltage RR #4 is updated (increased) to "9." Since the updated credit "9" of RR #4 is the same as the recovery credit "9" for the higher ordered read voltage RR #1, RR #1 and RR #4 switch places in the order. Thus, the new (updated) read order is: RR #4 (credit 9)→RR #1 (credit 8)→RR #0 (credit 7)→RR #2 (credit 6)→RR #3 (credit 5)→ . . . →RR #9 (credit 0).

FIG. 12 is a diagram illustrating an aggressive credit gaining scheme in accordance with an embodiment of the present invention. The gradual credit gaining scheme may be performed by the read order updater 840 in FIG. 8.

Referring to FIG. 12, N read threshold voltages RR #0 to RR #(N−1) for read retry operations are stored in the memory 810. An initial read order may be set in the order of the voltages: RR #0→RR #1→RR #2→RR #3→RR #4→ . . . →RR #(N−1). In other words, the first read threshold voltage RR #0 is the highest-ordered voltage, the second read threshold voltage RR #1 is the second highest-ordered voltage, and the Nth read threshold voltage RR #(N−1) is the lowest-ordered voltage. An initial recovery credit may be assigned to each of the read voltages. In the illustrated example, initial recovery credits may be assigned in the order: RR #0 (credit N)→RR #1 (credit N−1)→RR #2 (credit N−2)→RR #3 (credit N−3)→RR #4 (credit N−4)→ . . . →RR #(N−1) (credit 1). In other words, the higher a read voltage is in the read order the higher its recovery credit: the first read threshold voltage RR #0 has the highest credit, the second read threshold voltage RR #1 has the second highest credit, and the Nth read threshold voltage RR #(N−1) has the lowest credit.

When it is determined that the read operations using read threshold voltages RR #0 and RR #1 failed, and the read operation using the read threshold voltage RR #2 succeeded, the read order updater 840 may increase the recovery credit for the successful read voltage RR #2 by a set value. In some embodiments, the set value may be determined based on the current recovery credit for the successful read voltage RR #2 and the highest recovery credit N, such that the recovery credit of the successful read voltage RR #2 is increased (updated) to recovery credit N. In accordance with this update, the increased recovery credit "N" for the successful read voltage RR #2 is the same as the highest recovery credit "N" for the read voltage RR #0. The read order updater 840 may reduce the recovery credit for each read voltage currently having a credit greater than the recovery credit for the successful read voltage RR #2 by one. In this example, the recovery credit of read voltage RR #0 is reduced from N to N−1, and the recovery credit of read voltage RR #1 is reduced from N−1 to N−2. Thus, the new (updated) read order is: RR #2 (order 1)→RR #0 (order 2)→RR #1 (order 3)→RR #3 (order 4)→RR #4 (order 5)→ . . . →RR #(N−1) (order N).

FIG. 13 illustrates a process of iteratively updating the order of read threshold voltages according to an aggressive credit gaining scheme. In FIG. 13, RR # with a check mark "✓" represents a successful read threshold voltage and bolded RR # represents a read threshold voltage that has been moved up or down in the order.

Referring to FIG. 13, it is assumed that 10 read threshold voltages RR #0 to RR #9 have initial credits that descend in value down the order. For example, a read threshold voltage RR #0 has an initial credit "9," a read threshold voltage RR #1 has an initial credit "8," a read threshold voltage RR #2 has an initial credit "7", continuing to a read threshold voltage RR #9 that has an initial credit "0."

In a first round (1310), the read operations using the read threshold voltages RR #0 and RR #1 failed, and the read operation using the read threshold voltage RR #2 succeeded. The recovery credit "7" for the successful read voltage RR #2 is updated to "9." Further, initial recovery credits "9", "8" of RR #0 and RR #1, which are higher neighbors of the successful read voltage RR #2, are respectively updated to "8" and "7." Thus, the new (updated) read order is: RR #2 (credit 9)→RR #0 (credit 8)→RR #1 (credit 7)→RR #3 (credit 6)→RR #4 (credit 5)→ . . . →RR #9 (credit 0).

In a second round (1320), the read operations using the read threshold voltages RR #2, RR #0, RR #1 and RR #3 failed, and the read operation using the read threshold voltage RR #4 succeeded. The recovery credit "5" for the successful read voltage RR #4 is updated (increased) to "9." Further, recovery credits "9", "8", "7" and "6" of RR #2, RR #0, RR #1 and RR #3, which are higher neighbors of the successful read voltage RR #4, are respectively updated (reduced) to "8", "7", "6" and "5." Thus, the new (updated) read order is: RR #4 (credit 9)→RR #2 (credit 8)→RR #0 (credit 7)→RR #1 (credit 6)→RR #3 (credit 5)→ . . . →RR #9 (credit 0).

In a third round (1330), the read operations using the read threshold voltages RR #4, RR #2 and RR #0 failed, and the read operation using the read threshold voltage RR #1 succeeded. The recovery credit "6" for the successful read voltage RR #1 is updated (increased) to "9." Further, recovery credits "9", "8" and "7" of RR #4, RR #2 and RR #1, which are higher neighbors of the successful read voltage RR #1, are respectively updated (reduced) to "8", "7" and "6." Thus, the new (updated) read order is: RR #1 (credit 9)→RR #4 (credit 8)→RR #2 (credit 7)→RR #0 (credit 6)→RR #3 (credit 5)→ . . . →RR #9 (credit 0).

In a fourth round (1340), the read operation using the read threshold voltage RR #1 succeeded. The recovery credit "9" for the successful read voltage RR #1 is maintained. Thus, the new (updated) read order is: RR #1 (credit 9)→RR #4 (credit 8)→RR #2 (credit 7)→RR #0 (credit 6)→RR #3 (credit 5)→ . . . →RR #9 (credit 0).

In a fifth round (1350), the read operation using the read threshold voltage RR #1 succeeded. The recovery credit "9" for the successful read voltage RR #1 is maintained. Thus, the new (updated) read order is: RR #1 (credit 9)→RR #4 (credit 8)→RR #2 (credit 7)→RR #0 (credit 6)→RR #3 (credit 5)→ . . . →RR #9 (credit 0).

In a sixth round (1360), the read operation using the read threshold voltage RR #1 failed, and the read operation using the read threshold voltage RR #4 succeeded. The recovery credit "8" for the successful read voltage RR #4 is updated (increased) to "9." Further, the recovery credit "9" of RR #1, which are higher neighbor of the successful read voltage RR #4, is updated to "8." Thus, the new (updated) read order may is: RR #4 (credit 9)→RR #1 (credit 8)→RR #2 (credit 7)→RR #0 (credit 6)→RR #3 (credit 5)→ . . . →RR #9 (credit 0).

In a seventh round (1370), the read operation using the read threshold voltage RR #4 succeeded. The recovery credit "9" for the select read voltage RR #4 is maintained. Thus, the new (updated) read order is: RR #4 (credit 9)→RR #1 (credit 8)→RR #2 (credit 7)→RR #0 (credit 6)→RR #3 (credit 5)→ . . . →RR #9 (credit 0).

In an eighth round (1380), the read operation using the read threshold voltage RR #4 succeeded. The recovery credit "9" for the select read voltage RR #4 is maintained. Thus, the new (updated) read order is: RR #4 (credit 9)→RR #1 (credit 8)→RR #2 (credit 7)→RR #0 (credit 6)→RR #3 (credit 5)→ . . . →RR #9 (credit 0).

In the illustrated embodiments of FIGS. 11 and 13, it is assumed that successful read voltages in the eight rounds are: RR #2→RR #4→RR #1→RR #1→RR #1→RR

4→RR #4→RR #4. In comparison to the fixed order scheme, embodiments reduce total read attempts as shown in Table 1.

TABLE 1

| Read Attempts | Fixed Order Scheme | Embodiment (Gradual credit gaining scheme) | Embodiment (Aggressive credit gaining scheme) |
| --- | --- | --- | --- |
| Total | 29 | 23 | 18 |
| Round 1 | 3 | 3 | 3 |
| Round 2 | 5 | 5 | 5 |
| Round 3 | 2 | 3 | 4 |
| Round 4 | 2 | 2 | 1 |
| Round 5 | 2 | 1 | 1 |
| Round 6 | 5 | 4 | 2 |
| Round 7 | 5 | 3 | 1 |
| Round 8 | 5 | 2 | 1 |

Referring to Table 1, the total read attempts in the fixed order scheme is 29, the total read attempts in the gradual credit gaining scheme is 23, and the total read attempts in the aggressive credit gaining scheme is 18. The gradual credit gaining scheme may target a scenario in which memory cell condition changes slowly. The aggressive credit gaining scheme may target a scenario in which memory cell condition changes rapidly.

FIG. 14 is a flowchart illustrating an operation for determining a read threshold voltage based on credits in accordance with an embodiment of the present invention. The operation 1100 may be performed by firmware of the controller 100 including the read threshold determiner 830 in FIGS. 8 and 9.

Referring to FIG. 14, at operation 1410, the controller 100 may perform one or more read operations on the memory device using one or more read voltages among a plurality of read voltages in a set order.

At operation 1420, the controller 100 may detect a successful read operation among the one or more read operations.

At operation 1430, the controller 100 may determine one or more credits for the one or more read voltages in response to the detected successful read operation.

At operation 1440, the controller 100 may update the set order based on the determined credits.

At operation 1450, the controller 100 may perform additional read operations (i.e., another round of read operations) on the memory device based on the updated order.

In some embodiments, each of the plurality of read voltages has an initial credit that is different from the initial credit of each of the other read voltages.

In some embodiments, the plurality of read voltages are applied in a first order, and the initial credits are assigned to the plurality of read voltages in a second order such that the higher a read voltage is in the order, the higher its initial credit is.

In some embodiments, the initial credit for a successful read voltage is increased by a set value, in response to the successful read operation using the successful read voltage.

In some embodiments, the set value is one. In some embodiments, after the current credit of a successful read voltage is increased, that increased credit is compared with each of the current credits of the other read voltages. In some embodiments, when such comparison indicates that the increased (updated) credit of the successful read voltage is the same as the current credit of another read voltage, those two read voltages are swapped in the order.

In some embodiments, the set value is determined based on a current credit for the successful read voltage and the highest credit among the current credits of the other read voltages, such that the credit of the successful read voltage is increased (updated) to the highest credit. In some embodiments, when it is determined that the increased credit of the successful read voltage is the same as the highest credit associated with another of the read voltages, and each credit greater than the updated credit for the successful read voltage is reduced by one.

In some embodiments, the initial or current credits are retained (not changed) when the successful read voltage has the highest credit.

As described above, in the context of a memory system or device, embodiments provide a scheme for adaptively determining the order of read retry threshold voltages based on cell condition. Embodiments may improve performance, latency, consistency, robustness and quality of service (QoS) of a memory system by using a read retry table in which the order of the read voltages adaptively changes in response to results of previous read operations.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
a memory device; and
a controller configured to:
perform one or more read operations on the memory device using one or more read voltages among a plurality of read voltages in a set order;
detect a successful read operation among the one or more read operations;
determine one or more credits for the one or more read voltages, respectively, and in response to the detected successful read operation, incrementally add a value of 1 to an initial credit associated with a read voltage for the detected successful read operation; and
update the set order based on the determined credits,
wherein the plurality of read voltages have respective initial credits, each of which is different.

2. The memory system of claim 1, wherein the controller is further configured to perform additional read operations on the memory device based on the updated order.

3. The memory system of claim 1, wherein the controller includes a memory for storing the plurality of read voltages in the set order, each of the plurality of read voltages being stored in association with its determined credit.

4. A memory system comprising:
a memory device; and
a controller configured to:
perform one or more read operations on the memory device using one or more read voltages among a plurality of read voltages in a set order;
detect a successful read operation among the one or more read operations;
determine one or more credits for the one or more read voltages, respectively, in response to the detected successful read operation; and
update the set order based on the determined credits, wherein the plurality of read voltages have respective initial credits, each of which is different.

5. The memory system of claim 4, wherein the plurality of read voltages are applied in a first order, and the initial credits are assigned to the plurality of read voltages in a second order such that the higher a read voltage is in the order, the higher its initial credit is.

6. The memory system of claim 5, wherein the controller increases the initial credit for a successful read voltage by a set value, in response to the successful read operation using the successful read voltage.

7. The memory system of claim 6, wherein the set value is one, and
wherein the controller:
determines whether the increased credit of the successful read voltage is the same as any of the other initial credits; and
when it is determined that the increased credit is the same as another initial credit of another read voltage, swap the successful read voltage and the another read voltage in the set order to create an updated order.

8. The memory system of claim 6, wherein the set value is determined based on a credit for the successful read voltage and the highest of the initial credits of the other read voltages, such that the successful read voltage has the highest credit.

9. The memory system of claim 8, wherein the controller:
determines whether the increased credit is the same as the highest credit; and
when it is determined that the increased credit is the same as the highest credit, reduces each of credits greater than the credit for the successful read voltage by one.

10. The memory system of claim 5, wherein the controller maintains the multiple initial credits, in response to the successful read operation using the successful read voltage with the highest credit.

11. A method for operating a memory system, which includes a memory device and a controller coupled to the memory device, the method comprising:
performing one or more read operations on the memory device using one or more read voltages among a plurality of read voltages in a set order;
detecting a successful read operation among the one or more read operations;
determining one or more credits for the one or more read voltages, respectively, and in response to the detected successful read operation, incrementally adding a value of 1 to an initial credit associated with a read voltage for the detected successful read operation; and
updating the set order based on the determined credits,
wherein the plurality of read voltages have respective initial credits, each of which is different.

12. The method of claim 11, further comprising:
performing additional read operations on the memory device based on the updated order.

13. A method for operating a memory system, which includes a memory device and a controller coupled to the memory device, the method comprising:
performing one or more read operations on the memory device using one or more read voltages among a plurality of read voltages in a set order;
detecting a successful read operation among the one or more read operations;
determining one or more credits for the one or more read voltages, respectively, in response to the detected successful read operation; and
updating the set order based on the determined credits,
wherein the plurality of read voltages have respective initial credits, each of which is different.

14. The method of claim 13, wherein the plurality of read voltages are applied in a first order, and the initial credits are assigned to the plurality of read voltages in a second order such that the higher a read voltage is in the order, the higher its initial credit is.

15. The method of claim 14, wherein the determining of the credits for the one or more read voltages comprises:
increasing the initial credit for a successful read voltage by a set value, in response to the successful read operation using the successful read voltage.

16. The method of claim 15, wherein the set value is one;
wherein the determining of the credits for the one or more read voltages comprises: determining whether the increased credit of the successful read voltage is the same as any of the other initial credits; and
wherein the updating of the set order comprises: when it is determined that the increased credit is the same as another initial credit of another read voltage, swapping the successful read voltage and the another read voltage in the set order to create an updated order.

17. The method of claim 15, wherein the set value is determined based on a credit for the successful read voltage and the highest of the initial credits of the other read voltages, such that the successful read voltage has the highest credit.

18. The method of claim 17, wherein the determining of the credits for the one or more read voltages comprises:
determining whether the increased credit is the same as the highest credit; and
when it is determined that the increased credit is the same as the highest credit, reducing each of credits greater than the credit for the successful read voltage by one.

19. The method of claim 14, wherein the determining of the credits for the plurality of read voltages comprises:
maintaining the multiple initial credits, in response to the successful read operation using the successful read voltage with the highest credit.

20. A system comprising:
a memory to store executable instructions for using a plurality of read voltages for one or more read operations on a memory device; and
a control component in communication with the memory to read the executable instructions from the memory to:
perform one or more read operations on the memory device using one or more read voltages among a plurality of read voltages in a set order;
detect a successful read operation among the one or more read operations;
determine one or more credits for the one or more read voltages, respectively, and in response to the detected successful read operation, incrementally add a value of 1 to an initial credit associated with a read voltage for the detected successful read operation; and
update the set order based on the determined credits,
wherein the plurality of read voltages have respective initial credits, each of which is different.

* * * * *